(12) United States Patent
Armacost et al.

(10) Patent No.: US 6,232,222 B1
(45) Date of Patent: May 15, 2001

(54) METHOD OF ELIMINATING A CRITICAL MASK USING A BLOCKOUT MASK AND A RESULTING SEMICONDUCTOR STRUCTURE

(75) Inventors: Michael Armacost, Wallkill; Richard A. Conti, Mt. Kisco, both of NY (US); Jeffrey P. Gambino, Westford, VT (US); Jeremy K. Stephens, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/395,418

(22) Filed: Sep. 14, 1999

(51) Int. Cl.[7] ................... H01L 21/4763; H01L 21/336; H01L 21/302; H01L 21/461
(52) U.S. Cl. .......................... 438/637; 438/258; 438/671
(58) Field of Search .................................. 438/637, 258, 438/622, 618, 597, 257, 197, 717, 671

(56) References Cited
U.S. PATENT DOCUMENTS

| | | |
|---|---|---|
| 4,646,425 * | 3/1987 | Owens et al. .......................... 29/571 |
| 5,111,270 | 5/1992 | Tzeng . |
| 5,472,892 * | 12/1995 | Gwen et al. ........................... 437/43 |
| 5,556,796 | 9/1996 | Garnett et al. . |
| 5,665,629 | 9/1997 | Chen et al. . |
| 6,043,123 * | 3/2000 | Wang et al. .......................... 438/258 |

* cited by examiner

Primary Examiner—Amir Zarabian
Assistant Examiner—Adam Pyonin
(74) Attorney, Agent, or Firm—McGinn & Gibb, PLLC; Steven Capella, Esq.

(57) ABSTRACT

A method of forming a semiconductor structure may include forming a semiconductor substrate having an array region and a support region, forming a semiconductor substrate and a gate stack over the support region of the substrate and applying a critical mask over the support region and the array region. The critical mask may have a first opening at an area corresponding to the array region and a second opening at an area corresponding to the support region. Contact holes may be formed in a glass layer at areas corresponding to the first and second opening. After removing the critical mask, a first blockout mask may be applied over the array region and a first conductive type dopant may be added to exposed polysilicon corresponding to openings of the blockout mask or gate contacts may be formed.

16 Claims, 5 Drawing Sheets

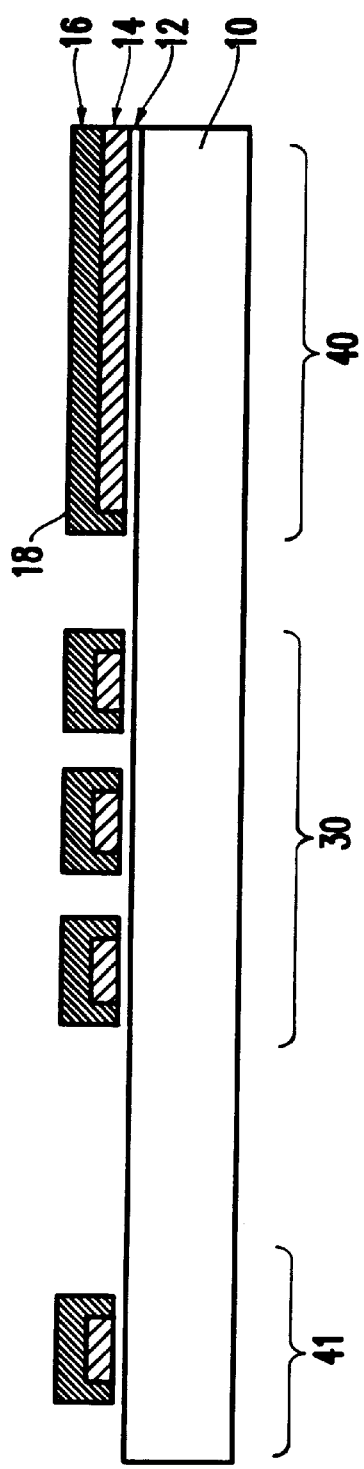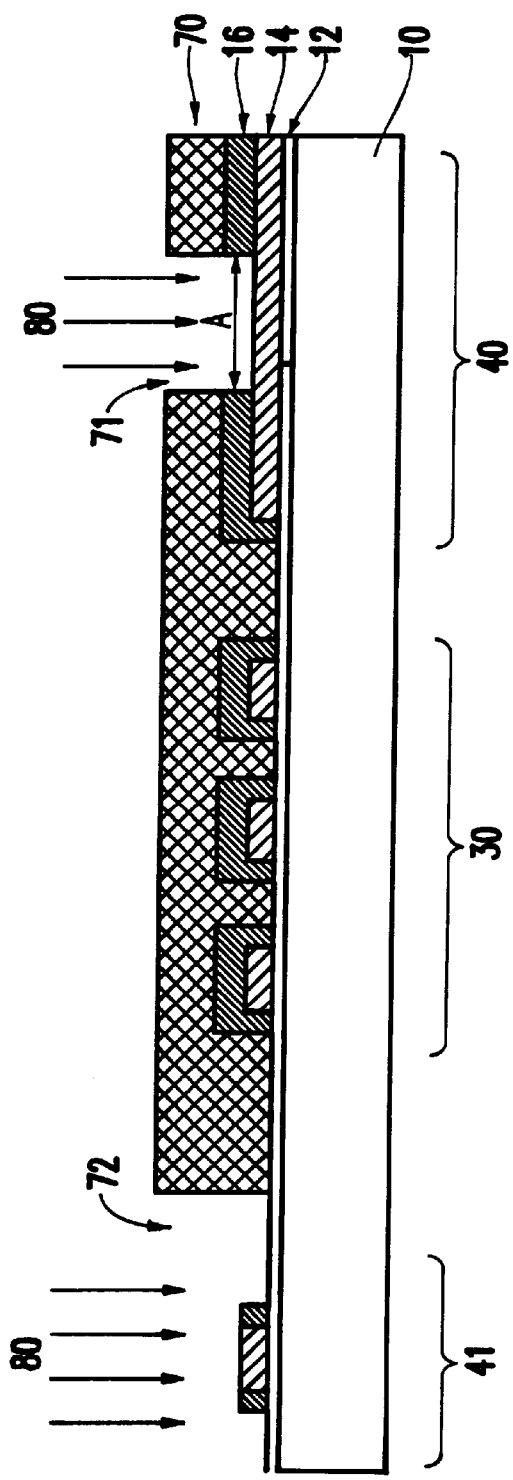

METHOD OF ELIMINATING A CRITICAL MASK USING A BLOCKOUT MASK AND A RESULTING SEMICONDUCTOR STRUCTURE

BACKGROUND OF THE INVENTION

1. Field of the Invention

The present invention generally relates to a method that reduces the use of critical masks by using a blockout mask. As a result, a unique semiconductor structure can be formed.

2. Description of the Related Art

Microelectronic circuit fabrication requires application of a series of photolithography masking steps for patterning of device structures. In advanced DRAM and logic circuits, fabrication process complexity can require more than one critical mask per level. Minimization of critical masks is critical for fabrication cost control. The present invention reduces the number of critical masks through introduction of a blockout mask. With this method, DRAM array and support contact holes can be formed in the same etching step. Similarly, logic gate conductors may be formed in the same step and later doped for a desired work function.

SUMMARY OF THE INVENTION

In view of the foregoing and other problems of the conventional methods, it is, therefore, an object of the present invention to provide a method of forming a semiconductor structure. The method may include forming a semiconductor substrate having an array region and a support region, forming a gate stack over an array region of the semiconductor substrate and a gate stack over the support region of the substrate. Each gate stack may include a polysilicon layer and a gate cap layer. A glass layer may be formed over the gate stacks and a critical mask may be applied over the glass layer. The critical mask may have a first opening at an area corresponding to the array region and a second opening at an area corresponding to the support region. Contact holes may be formed in the glass layer at areas corresponding to the first and second opening. The critical mask may then be removed and a first blockout mask may be applied over the structure to block certain portions of the structure.

A first conductive type dopant may then be added at uncovered areas of the structure. The contact holes may be filled with polysilicon or tungsten. The structure may be annealed to spread the first conductive type dopant over the polysilicon layer. Contact holes may then be formed by etching the gate cap layer and the polysilicon layer of the array region at areas of the second opening of the critical mask.

A second blockout mask may be applied over the structure to block certain portions of the structure. A second conductive type dopant may be added at uncovered areas of the structure.

The semiconductor structure may also be formed by applying a blockout mask over the array region and the support region. The blockout mask may have at least a first opening in an area over the support region. The first opening may have a first width as measured in the first direction. A first conductive type dopant may be added into areas of the support region corresponding to the first opening of the blockout mask.

A glass layer may be formed over the gate stacks. A critical mask may be applied and have a first opening in an area of the array region and a second opening in an area of the support region. The first opening may have a second width as measured in the first direction. Contact holes may be formed in the glass layer at areas corresponding to the first opening of the critical mask and the second opening of the critical mask. The width of the contact hole in the array region may be smaller than the first width.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein:

FIG. 4 is a diagram of a semiconductor structure according to a second embodiment of the present invention;

FIG. 5 is a diagram of a semiconductor structure having a blockout mask placed thereon according to the second embodiment of the present invention;

DETAILED DESCRIPTION OF PREFERRED EMBODIMENTS OF THE INVENTION

The present application takes advantage of similarities between the contact holes to the diffusion regions and the contact holes to the gate regions. As will be discussed below, the present application may utilize one critical mask to define the contact holes to the diffusion region and the contact holes to the gate region. This may eliminate a critical lithography step in the prior art while retaining the ability to etch the gate cap nitride and to implant the contacts to diffusion regions differently than the contacts to the gate.

Figure 1:
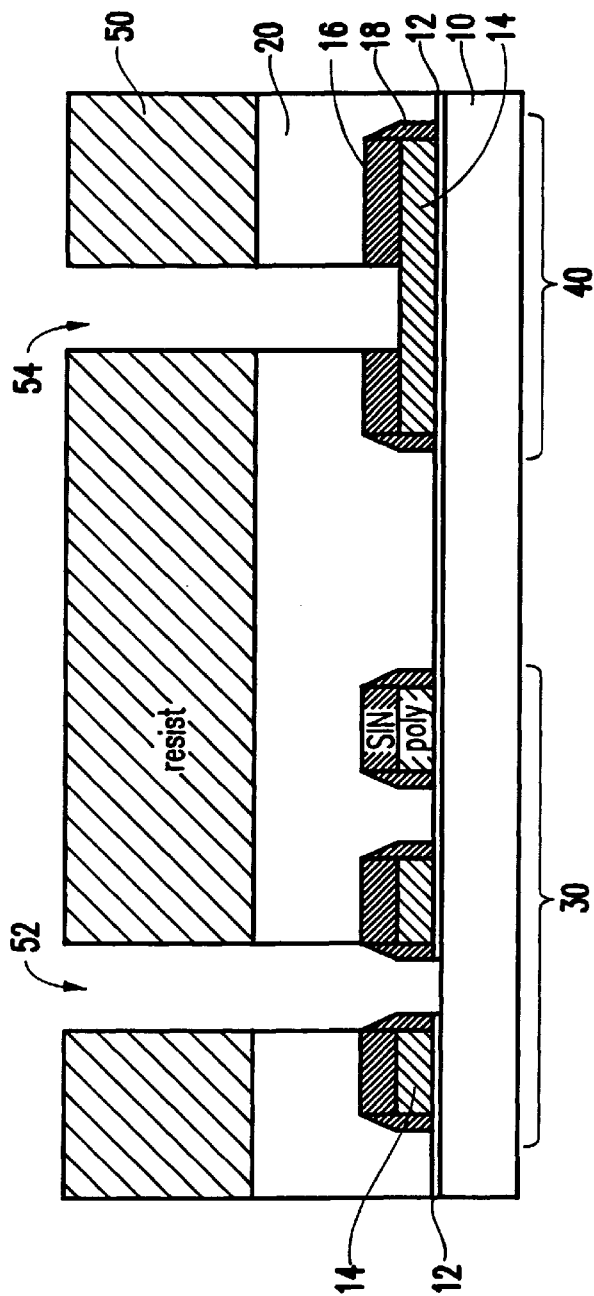
FIG. 1 is a diagram of a semiconductor structure having a critical mask placed thereon to form contact holes according to a first embodiment of the present invention.
Figure 2:
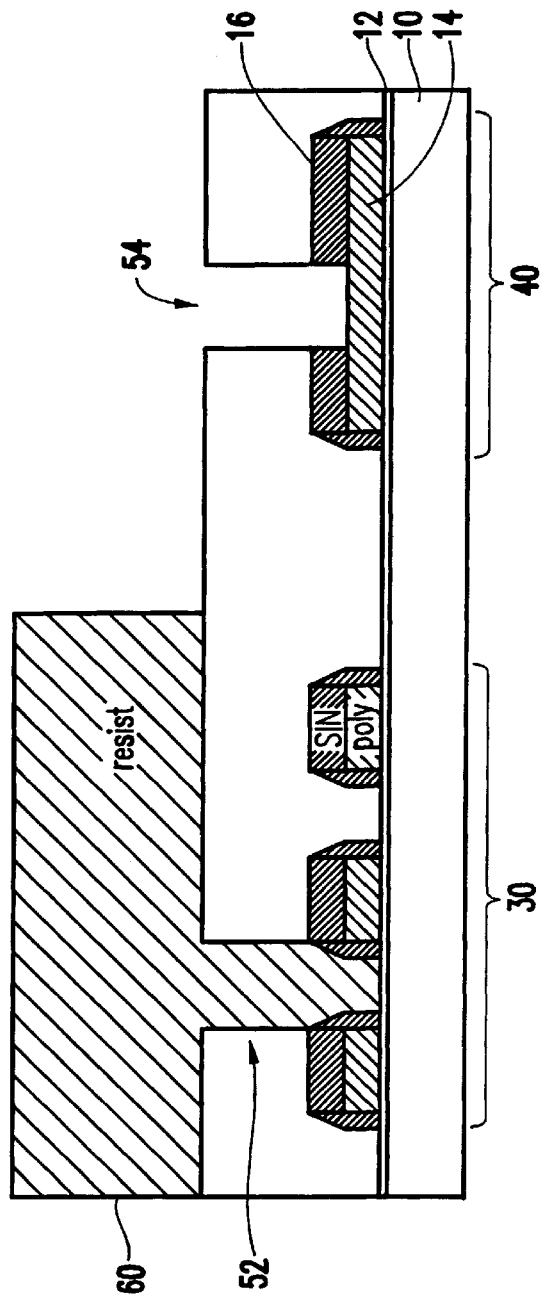
FIG. 2 is a diagram of a semiconductor structure having a blockout mask placed thereon according to the first embodiment of the present invention.
Figure 3:
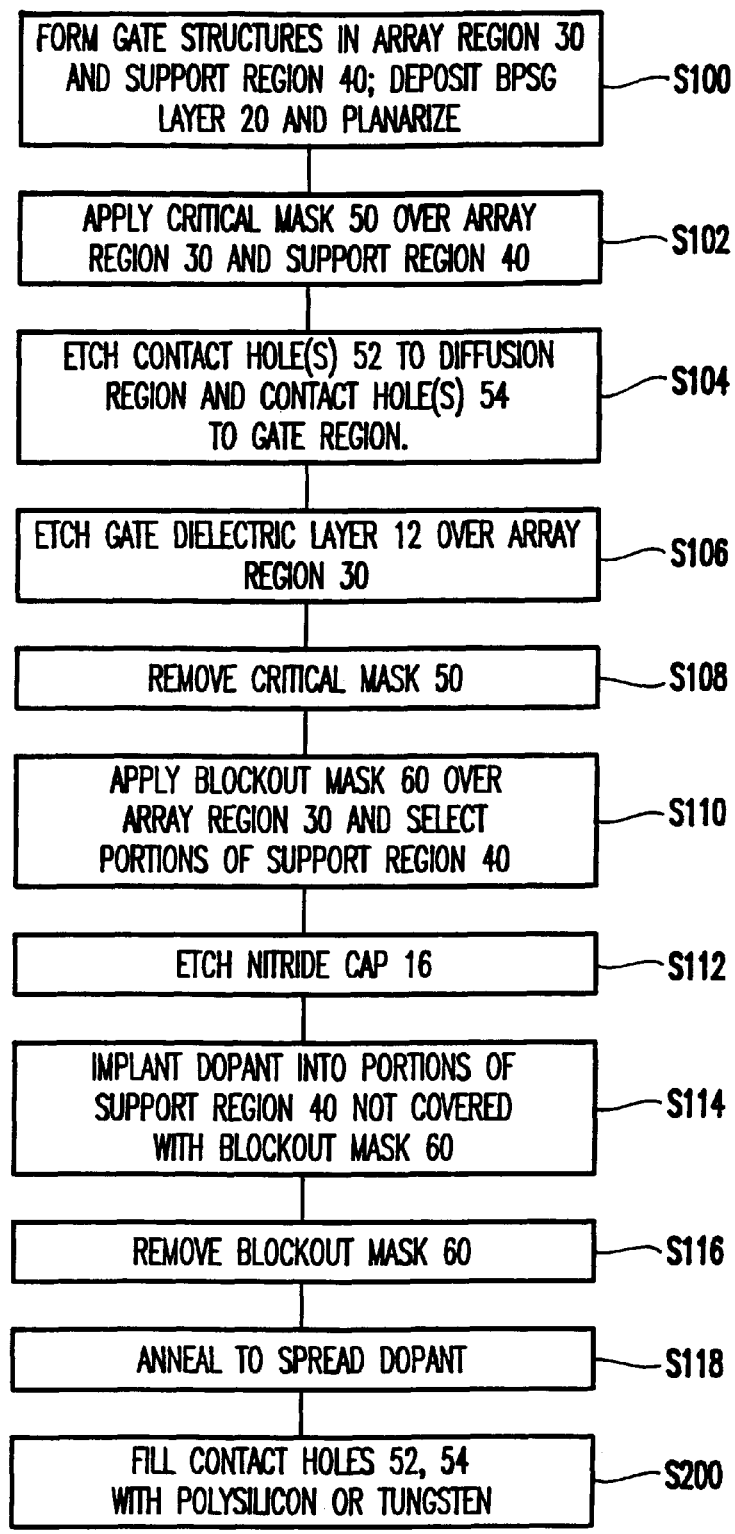
FIG. 3 is a flowchart showing steps according to the first embodiment of the present invention.

FIGS. 1–3 relate to a first embodiment of the present application. As shown in FIG. 1, a semiconductor substrate 10 is initially provided and a gate dielectric layer 12, such as $SiO_2$, is provided over the substrate 10. The semiconductor substrate 10 is typically silicon but can be any semiconductor material, such as Group II–VI semiconductor, Group III–V semiconductors or a composite silicon semiconductor such a silicon carbide. The semiconductor substrate 10 typically contains well doping regions which have been implanted prior to the formation of the overlying layers.

As is well known in the art, a semiconductor chip may include array regions and support regions. FIG. 1 shows array region 30 and support region 40. The array region 30 typically uses minimum feature size structures and borderless contacts to minimize memory cell size or maximize circuit density. The support regions 40 contain contacts to diffusions and gate conductors. The support regions 40 typically are at a relaxed lithographic ground rule and do not use borderless contacts.

Typically, two critical contact masks are required for processes with contacts that are borderless to gates. The first critical mask is used for the borderless contact; the etch must stop on the gate cap nitride to ensure isolation between the gate conductor and the contact. The second critical mask is used for the gate contacts; the etch must remove the gate cap nitride to ensure continuity between the contact and the gate conductor.

A gate stack is then deposited over the substrate 10 and the gate dielectric layer 12 in both the array region 30 and support region 40. As shown in FIG. 1, the gate stack may include an intrinsic (i.e., undoped) polysilicon layer 14 and a silicon nitride layer acting as a nitride cap 16. A tungsten silicide ($WSi_x$) or metal layer may be formed between the polysilicon layer 14 and the nitride cap 16. Spacers 18 may be formed along sides of the polysilicon layer 14 and the nitride cap 16 a in well-known manner.

A boron-doped glass (PSG) or a boron+phosphorous-doped glass (BPSG) 20 (hereafter BPSG layer 20) may then be conformally deposited over the patterned gate stacks and planarized. Subsequently, a critical mask 50 is applied over the BPSG layer 20 using standard lithography techniques. Typically, deep UV lithography is required for critical masks. The critical mask 50 includes openings to form contact holes in both the array region 30 and the support region 40. The contact holes 52 and 54 are formed in the BPSG layer 20 over the diffusion in the array region 30 and the support region 40, respectively, preferably using a polymerizing, dielectric etch with high selectivity to silicon nitride.

The gate dielectric layer 12 is then etched in the array region 30 using an F-based reactive ion etching technique (i.e., linear and gate oxide etch). This etching opens up the contacts to the diffusion region while the contacts to the gate in the support regions are still covered by the nitride cap 16. Dopant for the array contact may be applied at this point. The critical mask 50 is then removed with an oxygen-based resist strip.

Then, as shown in FIG. 2, a blockout mask 60 is applied over the array region 30 to block the array region 30 from subsequent implanting of dopants. The dimensions of the blockout mask 60 are typically much larger than those of the critical mask. Thus, mid UV lithography is generally used. The blockout mask 60 may also be applied over select portions of the support region 40 to block those portions from the subsequent implanting of dopants into contact holes over diffusions. The blockout mask 60 can also be used to expose regions where gate contacts are desired. The nitride cap 16 may then be etched at areas not covered by the blockout mask 60, exposing certain portions of the polysilicon layer 14. Hence, gate contacts can be made without an additional critical contact mask. A high dose of suitable dopants (i.e., As or P for N+ regions, B for P+ regions) are implanted into contact holes over diffusion regions to form ohmic contacts. Implants may be performed before or after the gate cap nitride etch. The blockout mask 60 is then removed with an oxygen-based strip process. Subsequently, the contact holes 52 and 54 may be filled with a conductor such as doped-polysilicon or tungsten.

The above-described process forms self-aligned contacts to the diffusion regions and contacts to the gate regions preferably using one critical mask and one blockout mask. Accordingly, the novel process helps eliminate a critical mask from the prior art methods while only adding an etching step to remove the gate cap nitride 16.

FIG. 3 shows a flowchart showing steps of the first embodiment of the present invention. In particular, in step S100, gate structures are formed in the array region 30 and the support region 40 and the BPSG layer 20 is deposited and planarized. A critical mask 50 is then applied over the array region 30 and the support region 40 in step S102. In step S104, contact hole(s) 52 are etched in the BPSG layer 20 to the diffusion region and contact hole(s) 54 are etched in the BPSG layer 20 to the gate region. Then, the gate dielectric layer 12 is etched in the array region 30 in step S106. The critical mask 50 is then removed in step S108. In step S110, the blockout mask 60 is applied over the array region 30 and select portions of the support region 40 to block from subsequent implanting. The gate cap nitride layer 16 is then etched in step S112 and a first conductive type dopant is implanted into portions of the support region 40 not covered with the blockout mask 60 in step S114. In step S116, the blockout mask 60 is removed. Steps S110, S112, S114 and S116 may then be repeated for a second conductive type dopant. The dopants may then be spread by annealing the structure in step S118. Finally, in step S120, the contact holes 52, 54 may be filled with polysilicon or tungsten in a well known manner.

FIGS. 4–8 show a second embodiment of the present invention. As shown in FIG. 4, a semiconductor substrate 10 is initially provided. The gate dielectric layer 12, the polysilicon layer 14, the nitride cap 16 and the spacers 18 may be formed in a similar manner to the first embodiment. FIG. 4 also shows the array region 30 and the support regions 40 and 41. Bordered contacts to the gate conductors are made in support region 40. Bordered contacts to the substrate or well implants are made in support region 41. Then, as shown in FIG. 5, a blockout mask 70 may be applied over the array region 30 and select portions of the support region 40 which will not receive the first conductive type dopant. The blockout mask 70 may have a first opening 71 which has a width shown by the arrow A. The first opening 71 width will be larger than the minimum feature size, as this blockout mask is not a critical mask by definition. The blockout mask 70 further has a second opening 72 which is wider than the gate stack provided in the support region 41. This allows the substrate 10 to be doped by the dopants 80 to form a diffuse region in the support region 41.

The first conductive type dopant 80 may be implanted into portions of the support region 40, 41 which are not covered by the blockout mask 70 to form diffusions adjacent to the gates. In a similar manner to that described above, N+ dopant (e.g., As or Phos) may be implanted into the exposed polysilicon layer 14 of the support region's NFETs.

Figure 6:
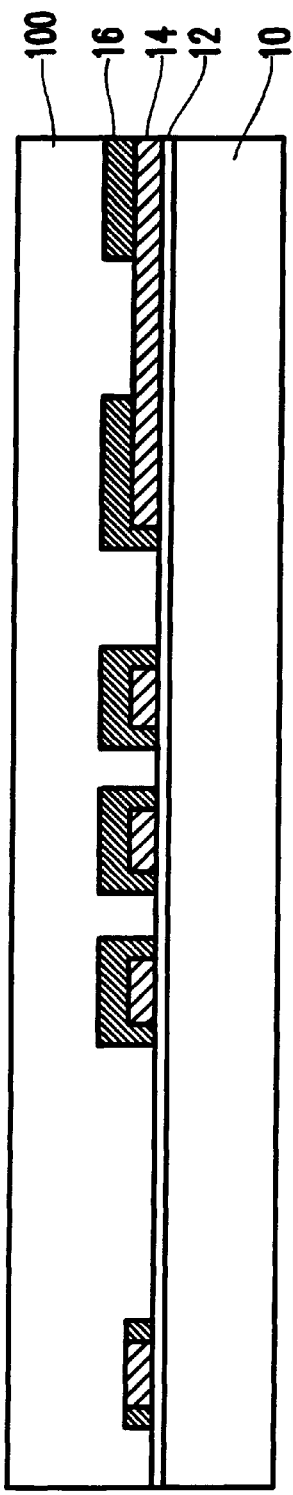
FIG. 6 is a diagram of a semiconductor structure according to the second embodiment of the present invention.

Subsequently, the nitride cap 16 is reactive ion etched in the support regions 40, 41 using an F-based etch. The implant may be performed before or after the gate nitride etch. If doping of the gates is desired, then the implant should be done after the gate nitride etch. After the gate cap nitride etch, dopant may be applied for the desired gate work function in support region 41. In a similar manner to the first embodiment, another blockout mask may be applied over the array region 30 and other portions of the support regions 40, 41, which will not receive the second conductive type dopant. The exposed nitride cap 16 may then be etched. Then, as shown in FIG. 6, a BPSG layer 100 is formed over the semiconductor substrate 10 and is planarized in a well known manner.

Figure 7:
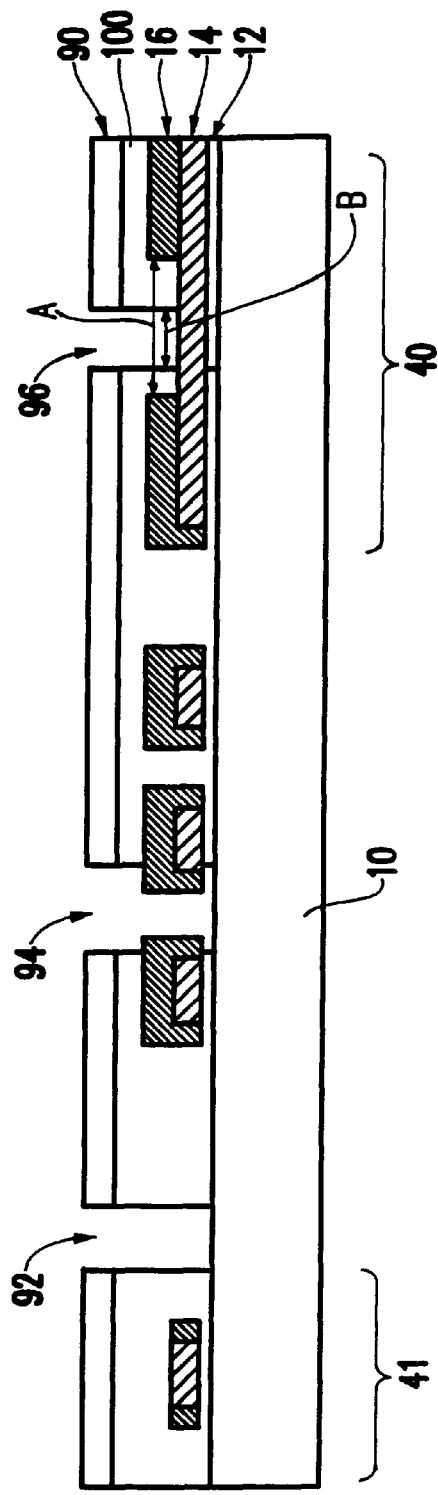
FIG. 7 is a diagram of a semiconductor structure having a critical mask placed thereon according to the second embodiment of present invention.

Then, as shown in FIG. 7, a critical mask 90 is applied over the BPSG layer 100 in the array region 30 and the support regions 40 and 41. The critical mask 90 is used to form the contact holes 92, 94 and 96 in the BPSG layer 100 by etching in a well known manner. As can clearly be seen in FIG. 7, the contact hole 96 formed in the BPSG layer 100 and over the gate in the support region 40 has a width shown by arrow B. This width is preferably the minimum feature size available with the critical mask. This width of the opening 96 shown by arrow B is smaller than the width of the opening shown by arrow A. As in the previous embodiment, the gate contact is formed without an additional critical mask for the contact. An additional benefit of this embodiment is that dual work function devices can be formed in the support regions despite the presence of the gate cap nitride in the array. The critical mask 90 is then removed and the contact holes 92, 94 and 96 are filled with polysilicon or tungsten in a well known manner.

A unique feature of this embodiment is the difference in the width shown by arrow A between edges of the nitride cap 16 and the width of the contact hole 96 shown by arrow B. The present invention allows the elimination of a critical mask which is utilized by the prior art.

Figure 8:
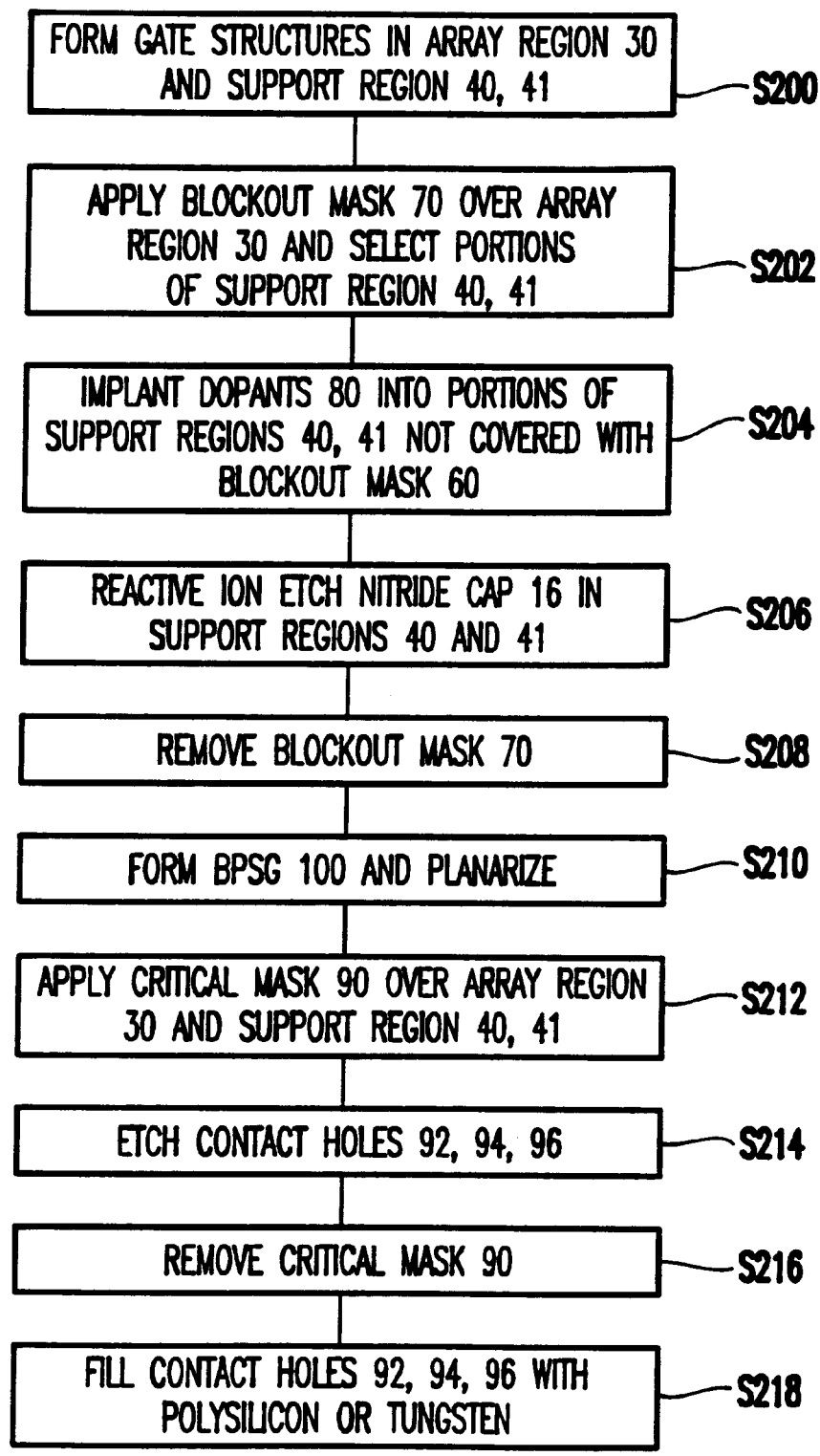
FIG. 8 is a flowchart showing steps according to the second embodiment of the present invention.

FIG. 8 shows a flowchart showing steps of the second embodiment of the present invention. In particular, gate structures are formed in the array region 30 and the support regions 40, 41 in step S200. In step S202, a blockout mask 70 is applied over the array region 30 and select portions of the support regions 40, 41. The dopants 80 may then be implanted into portions of the support regions 40, 41 that are not covered with the blockout mask 60 in step S204. In step S206, a nitride cap 16 is reactive ion etched in the support regions 40 and 41. In support region 40, exposed gate conductors may be implanted to improve contact resistance or change the gate's work function. A blockout mask 70 is then removed in step S208. In step S210, the BPSG layer 100 is formed and planarized. A critical mask 90 is then applied over the array region 30 and the support regions 40, 41 in step S212. In step S214, the contact holes 92, 94 and 96 are etched. The critical mask 90 is then removed in step S216 and the contact holes 92, 94 and 96 are subsequently filled with polysilicon or tungsten.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A method of forming contacts in a semiconductor structure, said semiconductor structure including at least one gate structure in a first portion, at least one diffusion region in a second portion, and an insulator layer over said gate structure and said diffusion region, said method comprising:

forming a first mask over said insulator layer, said first mask including a first opening over said diffusion region and a second opening over said gate structure;

etching said insulator layer using said mask to extend said first opening through said insulator layer such that said diffusion region is exposed through said first opening, and to extend said second opening through said insulator layer such that a top insulator layer of said gate structure is exposed through said second opening;

doping a first impurity in said diffusion region through said first opening;

removing said first mask;

forming a second mask over said diffusion region;

removing said top insulator layer from said gate structure;

doping a second impurity in said gate structure;

removing said second mask; and depositing conductive contacts in said first opening and said second opening of said insulator layer.

2. The method in claim 1, wherein said first mask has a higher lithographic resolution than said second mask.

3. The method in claim 1, wherein said top insulator layer of said gate structure protects said gate structure during said doping of said diffusion region.

4. The method in claim 1, wherein said second mask protects said gate structure during said doping of said gate structure.

5. The method in claim 1, wherein said removing of said top insulator layer comprises an etching process performed through said second opening.

6. The method in claim 1, wherein said first impurity is different than said second impurity.

7. The method in claim 1, wherein said first portion of said semiconductor structure comprises support devices and said second portion comprises array devices.

8. A method of forming contacts in a semiconductor structure, said semiconductor structure including at least one gate structure in a first portion, and at least one diffusion region in a second portion, said method comprising:

forming a first mask over said semiconductor structure;

selectively doping ones of said diffusion region and said gate structure through said first mask;

removing said first mask;

forming an insulator layer over said gate structure and said diffusion region;

forming a second mask over said insulator layer, said second mask including openings over said diffusion region and said gate structure, said second mask having a higher lithographic resolution than said first mask;

etching said insulator layer through said mask to extend said openings through said insulator layer to said diffusion region and said gate structure;

removing said second mask; and depositing conductive contacts in said openings of said insulator layer.

9. The method in claim 8, wherein said first portion of said semiconductor structure comprises support devices and said second portion comprises array devices.

10. The method in claim 8, wherein said selectively doping produces dual work function devices in said support devices.

11. A method of forming a semiconductor structure, said semiconductor structure including at least one gate structure in a first portion, at least one diffusion region in a second portion, and an insulator layer over said gate structure and said diffusion region, said method comprising:

forming a first mask over said insulator layer, said first mask including a first opening over said diffusion region and a second opening over said gate structure;

etching said insulator layer using said mask to extend said first opening through said insulator layer such that said diffusion region is exposed through said first opening, and to extend said second opening through said insulator layer such that a top insulator layer of said gate structure is exposed through said second opening;

doping a first impurity in said diffusion region through said first opening;

removing said first mask;

forming a second mask over said diffusion region, wherein said first mask has a higher lithographic resolution than said second mask;

removing said top insulator layer from said gate structure;

doping a second impurity in said gate structure;

removing said second mask; and depositing conductive contacts in said first opening and said second opening of said insulator layer.

12. The method in claim 11, wherein said top insulator layer of said gate structure protects said gate structure during said doping of said diffusion region.

13. The method in claim 11, wherein said second mask protects said gate structure during said doping of said gate structure.

14. The method in claim 11, wherein said removing of said top insulator layer comprises an etching process performed through said second opening.

15. The method in claim 11, wherein said first impurity is different than said second impurity.

16. The method in claim 11, wherein said first portion of said semiconductor structure comprises support devices and said second portion comprises array devices.

* * * * *